United States Patent [19]

Schwendener

[11] Patent Number: 5,676,810
[45] Date of Patent: Oct. 14, 1997

[54] TARGET MOUNTING-DEMOUNTING ARRANGEMENT

[75] Inventor: Urs Schwendener, Buchs, Switzerland

[73] Assignee: Balzers Aktiengesellschaft, Liechtenstein

[21] Appl. No.: 410,793

[22] Filed: Mar. 27, 1995

[30] Foreign Application Priority Data

Mar. 25, 1994 [DE] Germany ............... 44 10 466.9

[51] Int. Cl.[6] ................................... C23C 14/34
[52] U.S. Cl. .................. 204/298.09; 204/298.12; 204/298.41
[58] Field of Search ............ 204/298.09, 298.12, 204/298.41

[56] References Cited

U.S. PATENT DOCUMENTS 4,820,397  4/1989  Fielder et al. ............ 204/298.12
5,259,941  11/1993 Münz ......................... 204/298.09
5,421,978  6/1995  Schuhmacher et al. ..... 204/298.09

FOREIGN PATENT DOCUMENTS 0393344  10/1990  European Pat. Off. ...... 204/298.09

*Primary Examiner*—Aaron Weisstuch
*Attorney, Agent, or Firm*—Evenson, McKeown, Edwards & Lenahan, P.L.L.C.

[57] ABSTRACT

In order to permit a mounting and demounting of targets free of tools and essentially of friction, snap pins are provided on the system side which, when the target is inserted, automatically engage in a groove which is machined laterally into the target. A releasing slide permits the return of the pins. When the cooling system is acted upon by pressure, a heat transfer membrane is placed against the rear of the target and presses the target onto the snapped-in pins. The pins are released by a releasing slide after the cooling system is relieved from the pressure.

19 Claims, 1 Drawing Sheet

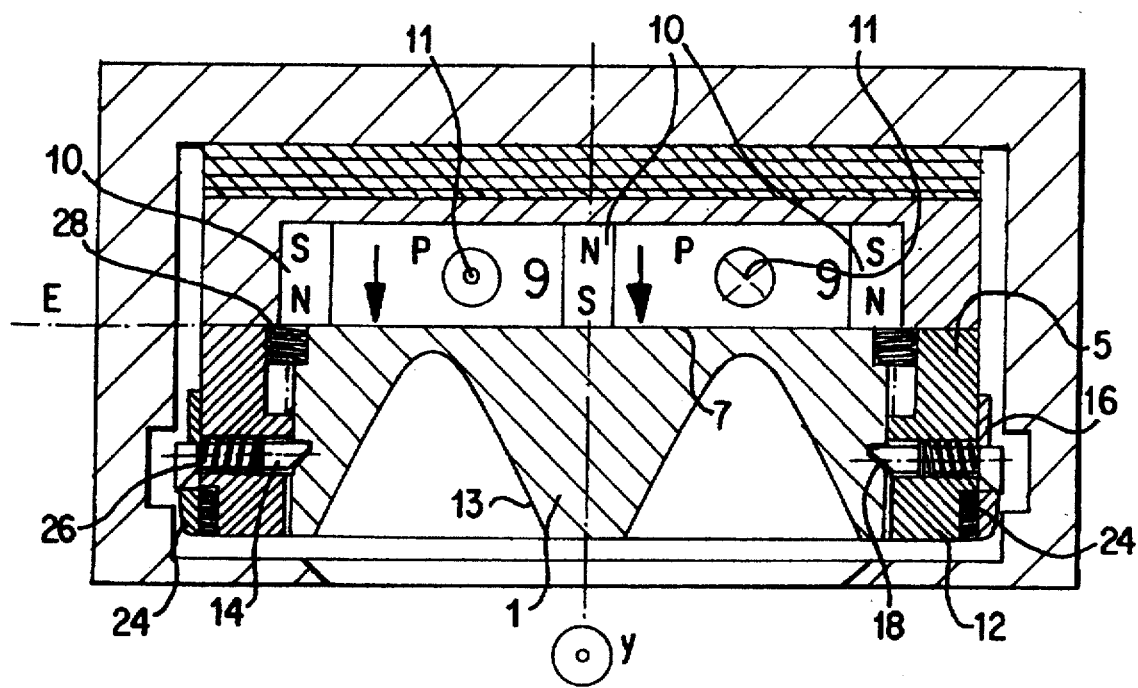
FIG. 1
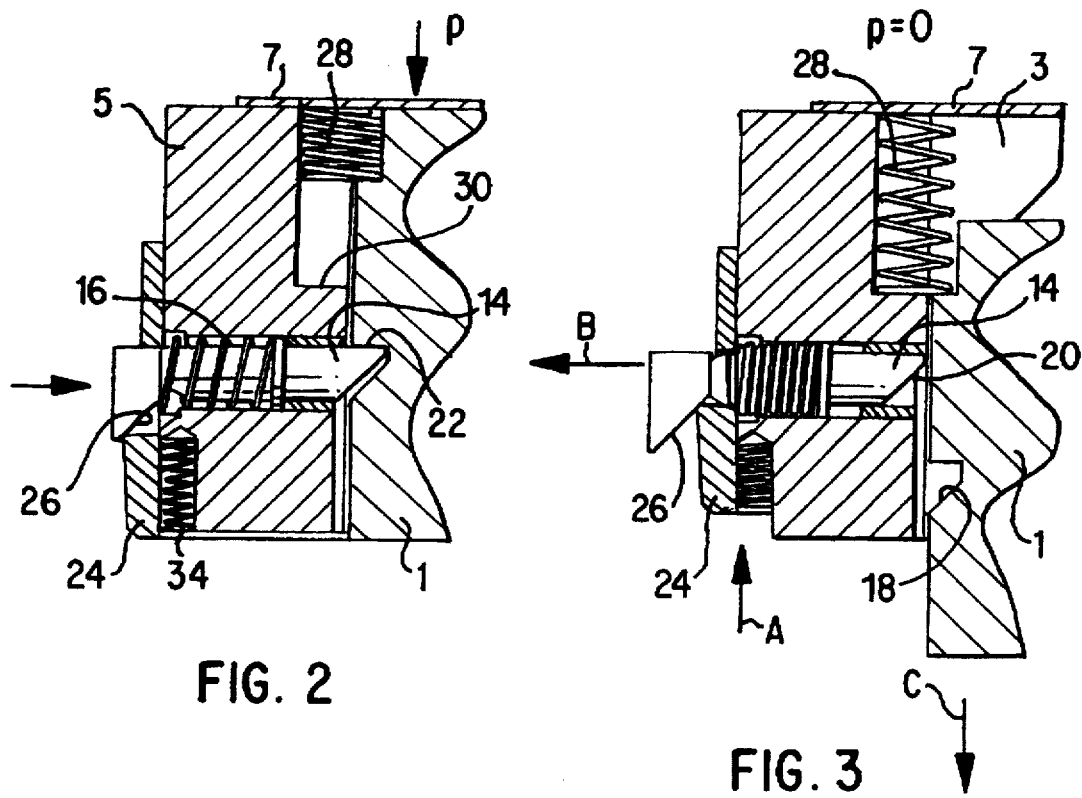
FIG. 2
FIG. 3

TARGET MOUNTING-DEMOUNTING ARRANGEMENT

BACKGROUND OF THE INVENTION

The present invention relates to an arrangement for mounting and demounting a target on an atomization or arc vaporization source, to a target with at least one recess on its lateral surfaces, as well as to a source with such an arrangement and with such a target, and also to a vacuum process chamber with such a source.

EP-A 0 512 456, which corresponds to U.S. Pat. No. 5,269,894, describes the problems which arise in the case of mounting and demounting arrangements and targets in relation to known arrangements. In the case of atomization sources, the use of screws for fastening a target is very time-consuming. As a result, often entire parts of the source (for example, in the case of magnetron sources, the cooling arrangement) are exchanged or even the entire source with the cooling arrangement and the magnet arrangement is exchanged in, for example, connection with magnetron sources. In this case, the use of special tools cannot be avoided.

Bayonet-type target fastening arrangements of the type shown in EP-A 0 512 456, or target fastening arrangements as shown in DE-A 40 20 659 require additional moving elements, such as balls, are subject to the risk of particle formation as a result of frictional intervention and/or of cold-setting of parts which are moved and braced relative to one another, and, are subject to the danger that, with the rotating movement required in the bayonet-catch arrangement, the relatively thin heat-conducting membrane between the cooling ducts and the target can be damaged.

SUMMARY OF THE INVENTION

It is an object of the present invention to provide a mounting/dismounting arrangement as well as a target and a source and a vacuum chamber which ensure a fast exchange of targets, without requiring any tools.

The arrangement according to the present invention is provided on atomization sources or arc vaporization sources, but particularly on atomization sources, and mainly on magnetron sources which may be operated at high power and make special demands on the efficiency of the cooling arrangement. Arc vaporization techniques are described in U.S. Pat. Nos. 4,673,477 and 4,839,011, particularly as far as the construction of such sources is concerned, and those descriptions are incorporated by reference herein.

Furthermore, although the targets used and constructed according to the present invention may have any physical shape, they are preferably round plate-shaped targets because round target plates are particularly easy to manufacture.

The foregoing objects have been achieved in accordance with the present invention by an arrangement in which wall sections which project upward from the plane and at least partially define a receiving space for the target, and the fastening elements include engaging pins arranged to be displaceable essentially parallel to the plane, viewed on the side of the receiving space for the target.

Because engaging pins are provided which can be displaced essentially in parallel to the membrane plane and which optionally may be arranged in the sense of a mechanical reversal also on the target, a precise positioning of the target by a corresponding recess becomes possible, and by admitting pressure to the cooling system and a corresponding tensioning of the membrane against the rear of the target, the target is rigidly held in position in a clamping manner on the introduced engaging pins so that the membrane can maintain an optimal thermal contact on the rear of the target.

Although it would definitely be possible to drive the engaging pins in a force-locking manner into the corresponding recess on the target, in a preferred embodiment of the present invention, the engaging pins are spring-tensioned such that, particularly if portions of the engaging pins which are disposed in a direction toward the receiving space are bevelled on a face opposite the membrane, when the target is introduced, they are automatically first pressed to the outside and when the recess on the target is aligned therewith, snap into the target.

For removing the target after relief of the cooling system pressure, the engaging pins are returned by releasing devices which can be implemented by a large number of construction variants. However, in a preferred implementation, the releasing devices are disposed on source-side wall sections to achieve the above-mentioned object of a mounting and demounting without tools.

Normally targets are mounted essentially flush with system-side or source-side edges of the receiving space so that, also after the release of the fastening by the relieving of the cooling system and the return of the engaging pins provided according to the present invention, a manual gripping of the target to be exchanged is difficult. In order to facilitate this gripping, a spring arrangement is provided according to the present invention which, when the engaging pin is released, pushes the target up so that it can be gripped comfortably.

With respect to the releasing devices for returning the engaging pins, it is easily implemented in accordance with the present invention to tension the engaging pins to spring or move to the outside and to drive them after the engagement in a form-locking manner into the recess on the target; that is, to provide a locking device which, for a locking operation, engages with the pins so that, after the removal of the releasing device, the engaging pins release the target in a spring-driven and automatic manner, and are driven to the outside.

BRIEF DESCRIPTION OF THE DRAWINGS

These and other objects, features and advantages of the present invention will become more readily apparent from the following detailed description thereof when taken in conjunction with the accompanying drawings wherein:

FIG. 1 a schematic and simplified cross-sectional view of a combination of an arrangement and of a target on a magnetron source all according to the present invention;

FIG. 2 a partial enlarged view of the arrangement of FIG. 1 while the target holding device is locked and tensioned; and FIG. 3 is a view similar to FIG. 2 but while the target plate is unlocked and released.

DETAILED DESCRIPTION OF THE DRAWINGS

Referring now to FIG. 1, a target 1 (in this embodiment, shown in the preferred plate shape and preferably round with advanced erosion troughs 13) is placed in a system-side or source-side receiving space 3 (see FIG. 3) provided for the target plate 1. The receiving space 3 for a target plate 1 of any shape, whether round, oval or rectangular, but preferably round, has at least two mutually opposite wall sections 5.

A cooling arrangement is provided on the rear of the target plate on the source, which basically comprises a cooling medium duct system which is sealingly closed off with respect to the receiving space 3 by a heat-conducting membrane 7, for example, a copper membrane. This type of cooling arrangement may be a separate cooling plate and, in the illustrated embodiment, is formed by the spaces 9 into which and out of which cooling medium pipes 11 lead. Through these cooling medium pipes 11, a cooling medium such as water is let in and out in a pressurized manner.

In the currently preferred implementation of the present invention on magnetron sources, as illustrated in FIG. 1, magnets 10 are provided which are separated from the target plate 1 by the membrane 7. These magnets can in a known manner be stationary or moving in order to influence the formation of the erosion trough 13. In the at least two mutually opposite wall sections 5, guide bores 12 are machined essentially in parallel to the plane E of the membrane 7, preferably in a continuous manner, in which case, the engaging pins 14 are spring tensioned toward the interior of the receiving space 3 by springs 16. FIGS. 2 and 3 show this arrangement in greater detail.

When the target plate 1 is inserted and braced as illustrated in FIGS. 1 and 2, the engaging pins 14 engage in at least one recess on the target-plate-side. This recess may be formed by bores but preferably is an elongated or even a surrounding groove 18. The pins 14 are provided with sloped surfaces 20 so that, when the target plate 1 is slid in, as soon as the groove 18 is aligned with the pins 14, the latter snap in automatically. In this case, the target plate 1 can be inserted perpendicularly with respect to the membrane plane, but optionally, as indicated by the direction y in FIG. 1 which is perpendicular to the plane of the paper, can also be slid in laterally or at least also laterally into the receiving space 3. Corresponding to the movement of the target plate for aligning the groove 18 with the pins 14, the sloped surfaces 20 are arranged so that, during this movement, the pins are first automatically pushed into the releasing position illustrated in FIG. 3 against the force of the spring 16 until they snap in.

In the tensioned condition, the cooling arrangement is acted upon by pressure p, as indicated in FIGS. 1 and 2, so that, as illustrated particularly in FIG. 2, the target plate 1 is pressed in area 22 against the snapped-in pins 14.

For the demounting of the target plate 1, after the pressure has been relieved (p=0), a releasing slide 24, as illustrated by arrow A in FIG. 3, is pressed onto a sloped surface 26 on the pin 14, whereby the latter is pushed against the force of the springs 16, out of the engagement with the target plate 1. This takes place in the direction of arrow B in FIG. 3.

For facilitating the removal of the target plate, tappet springs 28 are provided which are supported on one side on the source side and which, on the other side, act upon abutment surfaces 30 on the target plate 1. As a result, in the released condition and after p=0, as indicated in FIG. 3 so that the cooling medium arrangement has been relieved, the target plate is lifted in the direction C so that it can easily be gripped and removed. This is naturally mainly necessary when the source has an essentially upwardly-directed surface to be atomized, corresponding to surface 13.

As illustrated particularly in FIGS. 2 and 3, the releasing slide 24 is also prestressed by springs 34 such that, against spring force, the slide 24 can be pressed in in the direction A for releasing the pins 14 and then returned automatically.

Although the invention has been described and illustrated in detail, it is to be clearly understood that the same is by way of illustration and example, and is not to be taken by way of limitation. The spirit and scope of the present invention are to be limited only by the terms of the appended claims.

I claim:

1. An arrangement for mounting and dismounting of a target on a sputtering or an arc evaporation source, said target having a bottom surface opposite to a surface to be sputtered or evaporated, the arrangement comprising a membrane arranged to contact said bottom surface of said target; a cooling duct sealingly closed by said membrane, whereby said membrane is subjected to cooling medium pressure; wall sections projecting substantially perpendicular from a bottom surface of the membrane, said wall sections and said membrane bottom surface defining a receiving space for said target, with a spacing defined between the wall sections and the target prior to atomization or vaporization; and engaging members spaced from and extending substantially parallel to said membrane bottom surface into said space so as to be displaceable substantially parallel to said membrane bottom surface with respect to said wall sections to form-lockingly engage said target and being dimensioned so as to withstand biasing force resulting from said cooling medium during sputtering or vaporization operation via said membrane on said target bottom surface for firmly clamping said target with said membrane and preventing movement of the target in a direction perpendicular to said membrane bottom surface.

2. The arrangement according to claim 1, wherein the engaging members are spring-tensioned pins.

3. The arrangement according to claim 2, wherein the engaging pins are spring-tensioned toward the receiving space.

4. The arrangement according to claim 1, wherein portions of the engaging members are disposed adjacent the receiving space and are bevelled on a face thereof opposite the membrane.

5. The arrangement according to claim 4, wherein the engaging members are spring-tensioned pins.

6. An arrangement for mounting and dismounting of a target on a sputtering or an arc evaporation source, said target having a bottom surface opposite to a surface to be sputtered or evaporated, the arrangement comprising a membrane arranged to contract said bottom surface of said target, a cooling duct sealingly closed by said membrane, whereby said membrane is subjected to cooling medium pressure; wall sections projecting substantially perpendicular from a bottom surface of the membrane, said wall sections and said membrane bottom surface defining a receiving space for said target; and engaging members spaced from and extending substantially parallel to said membrane bottom surface into said space so as to displaceable substantially parallel to said membrane bottom surface with respect to said wall sections and being dimensioned so as to withstand biasing force resulting from said cooling medium via said membrane on said target bottom surface for firmly clamping said target with said membrane to a direction perpendicular to said membrane bottom surface, wherein releasing devices are displaceably arranged on the wall sections and are operatively connected with the engaging members to move the engaging members away from the receiving space.

7. The arrangement according to claim 6, wherein the engaging members are spring-tensioned pins.

8. The arrangement according to claim 6, wherein portions of the engaging members are disposed adjacent the receiving space and are bevelled on a face thereof opposite the membrane.

9. The arrangement according to claim 6, wherein the releasing devices comprise elements displaceably arranged essentially perpendicularly to a plane on the wall sections and are configured and arranged to act upon the engaging members by way of sloped surfaces thereon.

10. An arrangement for mounting and dismounting of a target on a sputtering or an arc evaporation source, said target having a bottom surface opposite to a surface to be sputtered or evaporated, the arrangement comprising a membrane arranged to contract said bottom surface of said target, a cooling duct sealingly closed by said membrane, whereby said membrane is subjected to cooling medium pressure; wall sections projecting substantially perpendicular from a bottom surface of the membrane, said wall sections and said membrane bottom surface defining a receiving space for said target; and engaging members spaced from and extending substantially parallel to said membrane bottom surface into said space so as to displaceable substantially parallel to said membrane bottom surface with respect to said wall sections and being dimensioned so as to withstand biasing force resulting from said cooling medium via said membrane on said target bottom surface for firmly clamping said target with said membrane to a direction perpendicular to said membrane bottom surface, wherein spring elements are arranged to act essentially perpendicularly to a plane extending in an atomization direction or a vaporization direction and on one side are supported on the member and on another side are biased on the target.

11. The arrangement according to claim 10, wherein the engaging members are spring-tensioned pins.

12. The arrangement according to claim 11, wherein portions of the engaging pins are disposed adjacent the receiving space and are bevelled on a face thereof opposite the membrane.

13. The arrangement according to claim 12, wherein releasing devices are displaceably arranged on the wall sections and are operatively connected with the engaging pins to move the engaging pins away from the receiving space.

14. The arrangement according to claim 13, wherein the releasing devices comprise elements displaceably arranged essentially perpendicularly to the plane on the wall sections and act upon the engaging pins by way of sloped surfaces thereon.

15. A target arrangement for an atomization or an arc vaporization source, which arrangement has a cooling duct for the target configured to be subjected to cooling medium pressure and closeable by a separating membrane which substantially determines a plane in an atomization direction or a vaporization direction, wall sections which project perpendicularly from the plane and at least partially define a receiving space for the target with a spacing defined between the wall sections and target prior to atomization or vaporization, and fastening elements for the target comprising engaging pins spaced from and extending substantially parallel to a surface of the membrane into the receiving space so as to be displaceable substantially parallel to the plane and the bottom surface, the target having at least one groove on lateral surfaces or a plurality of bores provided along said lateral surface thereof for form-locking engagement with the pins, wherein the engaging pins are dimensioned so as to withstand biasing force resulting from the cooling medium during atomization or vaporization via the membrane on the bottom surface for firmly clamping and preventing movement of the target in a direction perpendicular to the bottom surface.

16. An atomization or arc vaporization source, comprising a target and an arrangement for mounting and demounting the target, the arrangement configured to be subjected to cooling medium pressure via a cooling duct and to be closed off by a separating membrane substantially determining a plane in an atomization or a vaporization direction, wall sections projecting perpendicularly from the plane and at least partially defining a receiving space for the target, with a spacing defined between the wall sections and the target prior to atomization or vaporization and fastening elements for the target configured as engaging pins spaced from and extending substantially parallel to a bottom surface of the membrane into the receiving space so as to be displaceable essentially parallel to the plane to project into a recess in the target which, by pressurized admission of cooling medium to the cooling duct via the membrane, is braced four-lockingly with the engaging pins, and the engaging pins are dimensioned so as to withstand biasing force resulting from the cooling medium during vaporization or atomization via the membrane on the bottom surface for firmly clamping and preventing movement of the target in a direction perpendicular to the bottom surface.

17. An atomization or arc vaporization source comprising a target and an arrangement for mounting and demounting the target, the arrangement configured to be subjected to cooling medium pressure via a cooling duct and to be closed off by a separating membrane substantially determining a plane in an atomization or a vaporization direction, wall sections projecting perpendicularly from the plane and at least partially defining a receiving space for the target, and fastening elements for the target configured as engaging pins spaced from and extending substantially parallel to a bottom surface of the membrane into the receiving space so as to be displaceable essentially parallel to the plane to project into a recess in the target which, by pressurized admission of cooling medium to the cooling duct via the membrane, is braced with the engaging pins, and the engaging pins are dimensioned so as to withstand biasing force resulting from the cooling medium during vaporization or atomization via the membrane on the bottom surface for firmly clamping and preventing movement of the target in a direction perpendicular to the bottom surface, wherein spring elements are configured and arranged to act essentially perpendicularly to the plane and on one side are supported on membrane and, on another side, are biased on the target.

18. A vacuum process chamber comprising a source having a mounting-demounting arrangement for a target subjectable to cooling medium pressure via a cooling duct and closed off by a separating membrane substantially determining a plane in an atomization or a vaporization direction, wall sections projecting upwardly from the plane and at least partially defining a receiving space for the target, with a spacing defined between the wall sections and the target prior to atomization or vaporization and at least one fastening element configured as an engaging pin spaced from and extending substantially parallel to a bottom surface of the membrane into the receiving space so as to be displaceable essentially parallel to the plane, and the target has at least one recess, wherein the at least one engaging pin projects into the at least one recess, and the target, by pressurized admission of cooling medium to the cooling duct via the membrane, is form-lockingly braced by way of the at least one engaging pin, and the at least one engaging pin is dimensioned so as to withstand biasing force resulting from cooling member during atomization or vaporization via the membrane on the bottom surface for firmly clamping and preventing movement of the target in a direction perpendicular to the bottom surface.

19. A vacuum process chamber comprising a source having a mounting-demounting arrangement for a target subjectable to cooling medium pressure via a cooling duct and closed off by a separating membrane substantially determining a plane in an atomization or a vaporization direction, wall sections projecting upwardly from the plane and at least partially defining a receiving space for the target, and at least one fastening element configured as an engaging pin spaced from and extending substantially parallel to a bottom surface of the membrane into the receiving space so as to be displaceable essentially parallel to the plane, and the target has at least one recess, wherein the at least one engaging pin projects into the at least one recess, and the target, by pressurized admission of cooling medium to the cooling duct via the membrane, is braced by way of the at least one engaging pin, and the at least one engaging pin is dimensioned so as to withstand biasing force resulting from cooling member during atomization or vaporization via the membrane on the bottom surface for firmly clamping and preventing movement of the target in a direction perpendicular to the bottom surface, wherein spring elements are configured and arranged to act essentially perpendicularly to the plane and are supported, on one side thereof, on the membrane and, on another side thereof, are biased on the target.

* * * * *